April 25, 1967 S. POLANIECKI 3,316,478
REGENERATIVE FREQUENCY CHANGER FOR MULTIPLYING AND DIVIDING
Filed Oct. 23, 1963
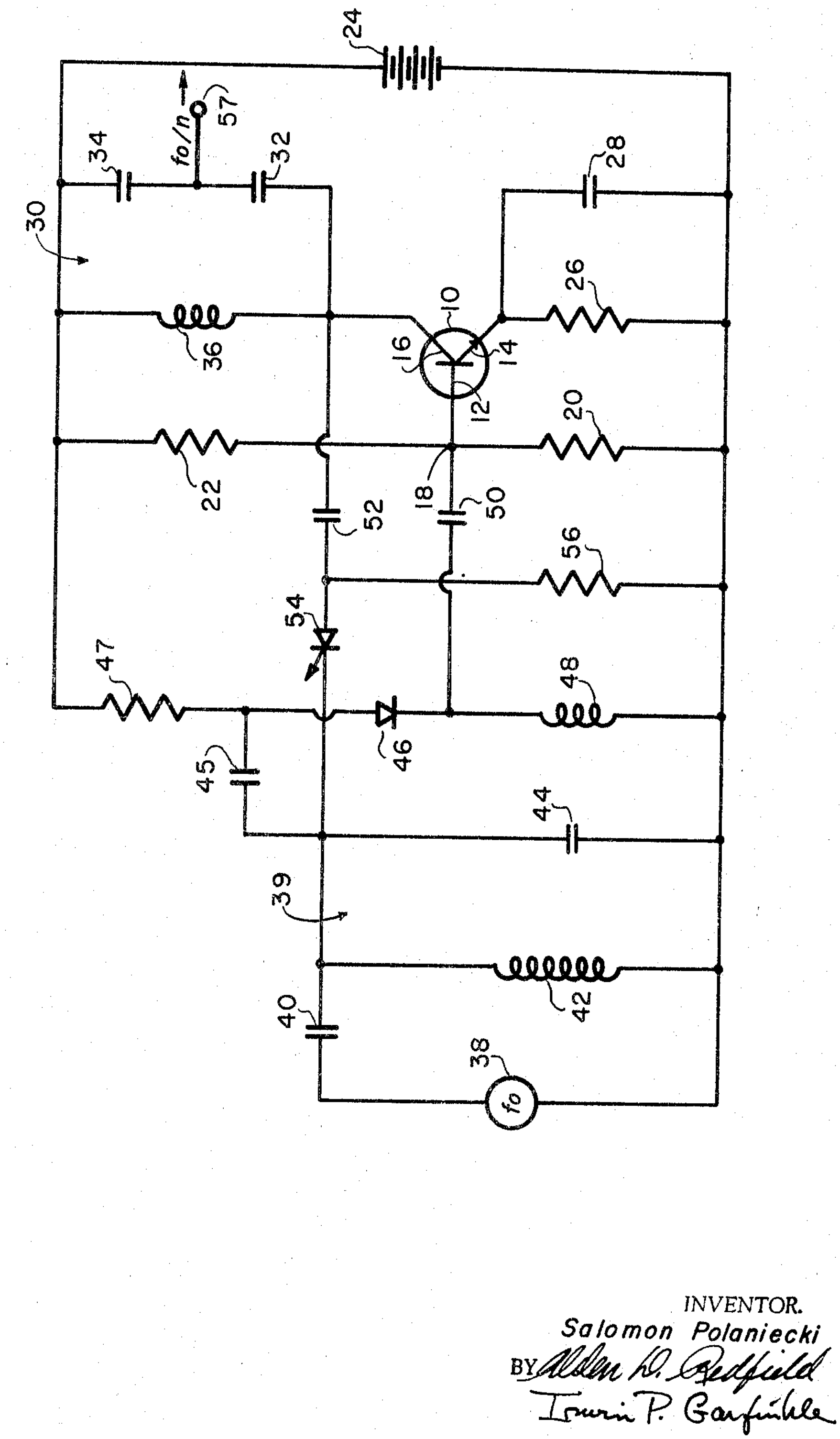
INVENTOR.
Salomon Polaniecki
BY Alden D. Redfield
Irwin P. Garfinkle
ATTORNEYS.

United States Patent Office 3,316,478
Patented Apr. 25, 1967

3,316,478
REGENERATIVE FREQUENCY CHANGER FOR MULTIPLYING AND DIVIDING

Salomon Polaniecki, Cincinnati, Ohio, assignor to Avco Corporation, Cincinnati, Ohio, a corporation of Delaware Filed Oct. 23, 1963, Ser. No. 318,409
1 Claim. (Cl. 321—65)

This invention relates to regenerative frequency changers, and is useful both as a frequency divider and as a frequency multiplier.

An object of this invention is to provide a regenerative frequency changer for multiplying or dividing an input frequency into one or more different output wave frequencies.

Another object of this invention is to provide a regenerative frequency divider or multiplier which includes means for regeneratively amplifying the generated harmonic.

A still further object of this invention is to provide a regenerative frequency divider or multiplier which includes means for parametrically amplifying the generated frequency.

A still further object of this invention is to provide voltage amplification of the multiplied frequency within the multiplier circuitry.

Generally, an input signal of one frequency is applied to an adder network in which a multiplicity of frequencies may already exist. The frequency of interest (a beat frequency) appears across the output circuit of a mixer and is then applied to an amplifier. The output of the amplifier is tuned to this particular frequency which is fed back for reamplification to the input circuit through a unique feedback network including a multiplier. Invention resides in the utter simplicity of the system for accomplishing improved results.

For a better understanding and for further objects of the invention, reference should now be made to the accompanying drawing in which the single figure illustrates one preferred embodiment of this invention.

The illustrated circuit is capable of deriving from an input signal $f_0$ an amplified signal output at a frequency $f_0/n$. $n$ may equal a whole number or fraction. The circuit uses an NPN-type transistor amplifier 10 having a base 12, an emitter 14, and a collector 16. Base bias for the transistor 10 is provided by means of a connection to the junction 18 of series-connected resistors 20 and 22 connected across a source of B+ supply illustrated as a battery 24. The emitter 14 is connected to the grounded side of the battery 24 through an emitter-resistor 26 by-passed for alternating currents by means of a capacitor 28. The collector 16 is connected to the other terminal of battery 24 through a resonant load circuit 30 comprising series-connected capacitors 32 and 34 connected in parallel with an inductor 36. The parameters of the resonant circuit 30 are chosen for resonance at frequency $f_0/n$.

Input signals at frequency $f_0$ are applied from a high impedance source 38 across a resonant circuit 39 including a coupling capacitor 40 and an inductor 42 connected in parallel with a capacitor 44. The resonant circuit 39 is tuned to a frequency of $f_0(n-1)/n$. Signals developed across the resonant tank circuit 39 are coupled to a diode 46 through a direct current blocking capacitor 45. Forward bias for diode 46 is provided through a resistor 47.

The semiconductor diode 46 is a non-linear device, and is incorporated to serve as a mixer for the system. The application of two signals at frequencies $f_0$ and $f_0(n-1)/n$ yields the sum and difference frequencies, and in this case the difference frequency $f_0/n$ is selected for amplification by the transistor 10. Selection is accomplished by use of an inductor 48 which is resonated by the distributed capacitance of the inductor and of the circuit at $f_0/n$. Capacitor 50 couples the voltage developed across the inductor 48 to the base 12 of transistor 10. The resonant circuit 30 in the load circuit of transistor 10 is also tuned to frequency $f_0/n$, and thus the output selected at terminal 57 is comprised mainly of a signal at frequency $f_0/n$.

In order to develop a voltage at frequency $f_0/(n-1)/n$ for application to mixer diode 46, a unique regenerative feedback path is provided from the collector 16 to the base 12 through a frequency multiplier comprising a direct current blocking capacitor 52 and a voltage-sensitive variable capacitance diode 54. A resistor 56 connected between the voltage-sensitive capacitance diode 54 and ground provides a running back bias for the diode 54.

The application of fed back output voltages at frequency $f_0/n$ to the voltage-sensitive capacitor 54 causes the generation of a wide spectrum of harmonics. Since the resonant tank circuit 39 is tuned approximately to frequency $f_0(n-1)/n$, substantially only that harmonic appears across tank circuit 39 for application to the mixer 46 along with the input signal at frequency $f_0$. Since the inductor 48 is resonated at frequency $f_0/n$, this frequency is selected for reamplification in the transistor 10.

During the positive half cycle of the input signal at frequency $f_0$, the diode 46 conducts and a signal is applied to the base 12, driving the transistor 10 into proportionate conduction dependent upon the effective direct voltage bias across the base-emitter junction. When the transistor 10 conducts, a low impedance current path is established through the capacitor 50 and the base-emitter junction of transistor 10 to produce an effective shunt across the resonant tank circuit 39. This shunt has the effect of loading the tank circuit 39, thereby lowering its Q and the voltage applied to the junction of diodes 46 and 54. On the negative half cycle the diode 46 cuts off, thereby cutting off conduction through the base-emitter junction of transistor 10 and hence removing the shunt from the tank circuit 39. This has the effect of restoring the tank circuit Q to its initial value and hence the voltage applied to the junction of diodes 54 and 46. Thus the diodes 46 and 54 are "pumped" by the input signal, and therefore, in addition to the reamplification taking place in the transistor 10, the pumping of the variable capacitance diode 54 results in the parametric amplification of the fed-back signals. Another important feature of this invention resides in the fact that the diode 54 is voltage rather than current driven, and therefore the feedback loop requires very little power for effective operation, and the efficiency of the system is improved.

A frequency multiplier, in accordance with this invention, was reduced to practice using the following circuit parameters:

The input signal $f_0=1$ mc.
The output signal $f_0/n=100$ kc.
Resonant circuit 39, resonant at $f_0(n-1)/n=900$ kc.
Resonant circuit 30, parallel resonant at $f_0/n=100$ kc.

| | | |
|---|---|---|
| Transistor **10** | | Type 2N2651 |
| Capacitors: | | |
| **28** | $\mu$f | 4.7 |
| **40** | pf | 27 |
| **45** | $\mu$f | .01 |
| **50** | $\mu$f | 1 |
| **52** | $\mu$f | .0033 |
| Resistors: | | |
| **20** | ohms | 3.3K |
| **22** | do | 1.8K |
| **26** | do | 2.2K |
| **56** | do | 100K |
| **47** | do | 100K |

Diodes:

| | |
|---|---|
| 46 | 1N645 (TI) |
| 54 | V–15E (PSI) |
| Inductor 48 ____mh__ | 10 |

The foregoing parameters were established to effect a frequency division in the order of 10 to 1. Capacitor 52 has a relatively non-critical optimum value for each range of operation. Capacitor 50 functions primarily as a direct current block, and it should have a fairly low impedance within the range of operation. The transistor 10 functions primarily as an amplifier of the generated frequencies. It simultaneously serves to amplify currents in the feedback loop. It is possible that the amplifier may comprise a plurality of stages for some applications.

Various adaptations and modifications will at once become apparent to persons skilled in the art. For example, while in the specific embodiment as reduced to practice the resonant circuit 39 was tuned to $f_0(n-1)/n$, in a different specific application it may be tuned to any frequency equal to $f_0(n \pm m)/n$ where $m$ is any number other than $n$ or zero, and the tank circuit 30 must be appropriately tuned to drive the desired output frequency. While a transistor was used and appears to be desirable for the particular embodiment as reduced to practice, vacuum tubes may be substituted by changing the values of the bias network, i.e., resistors 20 and 22. Furthermore, the amplifier might be an odd-number stage direct-coupled system for high gain. It is intended, therefore, that this invention be limited only by the appended claim as interpreted in the light of the prior art.

I claim:

A frequency multiplier for multiplying an input frequency $f_0$ to an output frequency $f_0/n$, where $n$ is any number, comprising:

a high impedance source of input signals at frequency $f_0$;

a first parallel resonant circuit connected across said source, said parallel resonant circuit being tuned to a frequency $f_0(n-1)/n$;

a non-linear semiconductor impedance device;

an amplifier comprising a transistor having base, emitter, and collector electrodes;

an input circuit for said amplifier, said input circuit comprising an inductor tuned to frequency $f_0/n$, said inductor being connected in series with said non-linear semiconductor impedance device across said first parallel network, said inductor being connected across the base and emitter electrodes of said transistor;

an output circuit for said amplifier, said output circuit comprising a second parallel resonant circuit tuned to said output frequency $f_0/n$;

a regenerative feedback path from said output circuit to said input circuit, said feedback path including a voltage sensitive variable capacitance semiconductor device in series with said non-linear impedance device and said inductor, said feedback circuit constituting a series resonant network tuned broadly to said output frequency $f_0/n$;

and means for establishing a running direct voltage back bias on said voltage sensitive variable capacitance semiconductor device.

References Cited by the Examiner

UNITED STATES PATENTS

| | | | |
|---|---|---|---|
| 2,816,220 | 12/1957 | Goodrich | 307—88.5 |
| 2,991,359 | 7/1961 | Danker | 307—88.5 |
| 3,230,396 | 1/1966 | Boelke | 307—88.5 |

JOHN F. COUCH, *Primary Examiner.*

G. GOLDBERG, *Assistant Examiner.*